United States Patent
Bi et al.

(10) Patent No.: US 10,347,731 B2
(45) Date of Patent: Jul. 9, 2019

(54) TRANSISTOR WITH ASYMMETRIC SPACERS

(71) Applicant: International Business Machines Corporation, Armonk, NY (US)

(72) Inventors: Zhenxing Bi, Niskayuna, NY (US); Kangguo Cheng, Schnectady, NY (US); Heng Wu, Guilderland, NY (US); Peng Xu, Guilderland, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/159,673

(22) Filed: Oct. 14, 2018

(65) Prior Publication Data

US 2019/0140064 A1    May 9, 2019

Related U.S. Application Data

(63) Continuation of application No. 15/808,869, filed on Nov. 9, 2017, now Pat. No. 10,134,859.

(51) Int. Cl.
*H01L 29/423* (2006.01)
*H01L 29/08* (2006.01)
(Continued)

(52) U.S. Cl.
CPC .......... *H01L 29/42364* (2013.01); *H01L 21/823425* (2013.01); *H01L 21/823468* (2013.01); *H01L 29/0688* (2013.01); *H01L 29/0843* (2013.01); *H01L 29/0847* (2013.01); *H01L 29/6656* (2013.01); *H01L 29/66545* (2013.01); *H01L 29/66659* (2013.01); *H01L 29/78* (2013.01)

(58) Field of Classification Search
CPC ......... H01L 21/823425; H01L 29/0843; H01L 29/42364; H01L 29/78; H01L 29/0688; H01L 21/823468; H01L 29/66659; H01L 29/66545; H01L 29/6656; H01L 29/0847
See application file for complete search history.

(56) References Cited

U.S. PATENT DOCUMENTS

| | | | |
|---|---|---|---|
| 4,962,054 A | 10/1990 | Shikata | |
| 6,121,093 A | 9/2000 | Cheng et al. | |

(Continued)

FOREIGN PATENT DOCUMENTS

| CN | 104779292 | 7/2015 |
|---|---|---|
| KR | 10-1682420 | 12/2016 |
| WO | WO 2013075690 | 5/2013 |

OTHER PUBLICATIONS

Goel, Ashish et al., Asymmetric Drain Spacer Extension (ADSE) FinFETs for Low-Power and Robust SRAMs, IEEE Transactions on Electron Devices, vol. 58, No. 2, pp. 296-308, Feb. 2011.

(Continued)

*Primary Examiner* — Savitri Mulpuri
(74) *Attorney, Agent, or Firm* — Vazken Alexanian; Otterstedt, Ellenbogen & Kammer, LLP

(57) ABSTRACT

A field-effect transistor device including an asymmetric spacer assembly allows lower parasitic capacitance on the drain side of the device and lower resistance on the source side. The asymmetric spacer assembly is formed by a self-aligned process, resulting in less gate/junction overlap on the drain side of the device and greater gate/junction overlap on the source side of the device. Asymmetric transistors having small gate lengths can be obtained without overlay/misalignment issues.

6 Claims, 6 Drawing Sheets

(51) Int. Cl.
*H01L 29/66* (2006.01)
*H01L 21/8234* (2006.01)
*H01L 29/06* (2006.01)
*H01L 29/78* (2006.01)

(56) References Cited

U.S. PATENT DOCUMENTS

| | | |
|---|---|---|
| 6,610,576 B2 | 8/2003 | Nowak |
| 7,585,735 B2 | 9/2009 | Mathew et al. |
| 7,768,006 B2 | 8/2010 | Zhu et al. |
| 8,138,030 B2 | 3/2012 | Chang et al. |
| 8,158,482 B2 | 4/2012 | Hoentschel et al. |
| 8,574,991 B2 | 11/2013 | Hoentschel et al. |
| 8,796,735 B2 | 8/2014 | Lauer et al. |
| 8,969,160 B2 | 3/2015 | Piao et al. |
| 9,040,960 B2 | 5/2015 | Chen et al. |
| 9,142,660 B2 | 9/2015 | Guo et al. |
| 9,362,383 B1 | 6/2016 | Balakrishnan et al. |
| 9,391,204 B1 | 7/2016 | Cheng et al. |
| 9,508,597 B1 | 11/2016 | Liu et al. |
| 9,543,435 B1 | 1/2017 | Basker et al. |
| 9,634,138 B1 | 4/2017 | Choi et al. |
| 9,659,942 B1 | 5/2017 | Basker et al. |
| 9,837,403 B1 | 12/2017 | Bi et al. |
| 9,905,647 B2 | 2/2018 | Fay et al. |
| 2002/0034854 A1 | 3/2002 | Lu et al. |
| 2012/0168832 A1 | 7/2012 | Anderson et al. |
| 2016/0056278 A1 | 2/2016 | Avci et al. |
| 2017/0084726 A1 | 3/2017 | Balakrishnan et al. |

OTHER PUBLICATIONS

Kangguo Cheng, unpublished U.S. Appl. No. 16/016,477 Tunnel Transistor, Jun. 22, 2018, pp. 1-29 plus 6 sheets drawings.
Zhenxing Bi, unpublished U.S. Appl. No. 15/808,869 Transistor With Asymmetric Spacers, filed Nov. 9, 2017, pp. 1-29 plus 6 sheets drawings.
Machine translation of KR 10-1682420.
IBM, Tunnel FET with Intermediate Tunneling Layer (TFITL),IP.com, No. IPCOM000187376D, Sep. 3, 2009.
Wang, Wei et al., Design of U-Shape Channel Tunnel FETs With SiGe Source Regions, IEEE Transactions on Electronic Devices, vol. 61, No. 1, Jan. 2014.
English translation of abstract of CN 104779292.
Kangguo Cheng, unpublished U.S. Appl. No. 16/016,454 Transistor With Asymmetric Source/Drain Overlap, Jun. 22, 2018, pp. 1-26 plus 6 sheets drawings.
Paul J. Otterstedt, List of IBM Patents or Patent Applications Treated as Related, Oct. 24, 2018, 2 Pages.

TRANSISTOR WITH ASYMMETRIC SPACERS

CROSS REFERENCE TO RELATED APPLICATION

This application is a continuation of U.S. patent application Ser. No. 15/808,869 filed Nov. 9, 2017, the complete disclosure of which is expressly incorporated herein by reference in its entirety for all purposes.

BACKGROUND

The present invention relates generally to the electronic arts and, more particularly, to field-effect transistors and their fabrication.

There is a trade-off between source/drain series resistance and gate to source/drain capacitance in the design of symmetric planar metal oxide semiconductor field-effect transistors (MOSFETs). Specifically, FET saturated currents are more sensitive to source resistance and less sensitive to drain resistance. FET drive current improves more with reduced source resistance than with reduced drain resistance. Additionally, circuit delay is more sensitive to gate to drain capacitance than gate to source capacitance. That is, due to the Miller effect, the gate to drain capacitance can impact circuit delay significantly more than gate to source capacitance. However, some techniques associated with reducing source/drain resistance to improve drive current often simultaneously increase the gate to drain capacitance, thereby increasing circuit delay. Similarly, some techniques associated with reducing gate to source/drain capacitance often simultaneously increase source resistance, thereby degrading drive current. Thus, there is often an intrinsic trade-off between decreasing source resistance to improve drive current and decreasing gate to drain capacitance to minimize circuit delay.

Asymmetric transistors are attractive for some applications. An asymmetric MOSFET, for example, may have asymmetric source/drain regions to address problems relating to the Miller effect. Source/drain regions that have different heights and/or widths or be different distances from the gate electrode are among the elements that may be found in an asymmetric MOSFET.

BRIEF SUMMARY

Asymmetric field-effect transistor structures and techniques for fabricating such structures are disclosed.

In one aspect, an exemplary asymmetric field-effect transistor device includes doped source and drain regions, a semiconductor channel operatively associated with the doped source and drain regions, a first doped junction between the doped source region and the semiconductor channel, a second doped junction between the drain region and the semiconductor channel, a gate electrode including a drain side and a source side, and a gate dielectric layer between the gate electrode and the semiconductor channel. A first drain side spacer extends over the drain side of the gate electrode. A second drain side spacer adjoins the first drain side spacer and also extends over the drain side of the gate electrode. A source side spacer extends over the source side of the gate electrode. The first and second drain side spacers and the source side spacer are configured such that the gate electrode overlaps a larger area of the first doped junction between the source region and the semiconductor channel than the second doped junction between the drain region and the semiconductor channel.

In another aspect, an exemplary method of fabricating an asymmetric field-effect transistor device is provided. The method includes obtaining a structure including a semiconductor substrate, a pad dielectric layer on the substrate, a plurality of sacrificial mandrels extending vertically from the pad dielectric layer, a pair of dummy gates on each of the sacrificial mandrels, each dummy gate having a drain side adjoining one of the sacrificial mandrels, and a filler layer between a first dummy gate on a first of the sacrificial mandrels and a second dummy gate on a second of the sacrificial mandrels. Each of the first and second dummy gates has a source side adjoining the filler layer. The sacrificial mandrels are removed, thereby forming a plurality of first trenches between the drain sides of the dummy gates. A plurality of first spacers is formed on the drain sides of the dummy gates and within the first trenches. The filler layer between the first and second dummy gates is removed, thereby forming a second trench and exposing the source sides of the first and second dummy gates. A plurality of second spacers is formed on the plurality of first spacers within the first trenches and on the source sides of the first and second dummy gates within the second trench. Doped drain and source regions are formed on the semiconductor substrate. The doped drain region is aligned with one of the first trenches and the doped source region is aligned with the second trench. At least the first dummy gate is removed and a gate dielectric layer is formed on the substrate. A gate electrode is formed over the gate dielectric layer, the gate electrode including a source side, a drain side, and a bottom side. One of the second spacers extends over the source side of the gate electrode and an opposing pair of the first and second spacers extends over the drain side of the gate electrode. First and second doped junctions extending respectively from the source region and from the drain region are formed. The first doped junction is positioned at least partially beneath the second spacer extending over the source side of the gate electrode and the second doped junction is positioned at least partially beneath a pair of the first and second spacers extending over the drain side of the gate electrode. The gate electrode overlaps a larger area of the first doped junction than the second doped junction. A portion of the semiconductor substrate beneath gate dielectric layer and the bottom side of the gate electrode comprises the channel region of the transistor.

In a further aspect, a method of fabricating an asymmetric field-effect transistor device includes obtaining a structure including a semiconductor substrate, a dummy gate extending above the semiconductor substrate, the dummy gate having a drain side and a source side, and a protective layer on the source side of the dummy gate. A first spacer is formed on the drain side of the dummy gate and the protective layer is removed. A plurality of second spacers is formed. One of the second spacers is formed on the first spacer to form a bilayer spacer. A second of the second spacers is formed on the source side of the dummy gate. Doped drain and source regions are formed on the semiconductor substrate. The dummy gate is removed and a gate dielectric layer is formed on the substrate. A gate electrode is formed over the gate dielectric layer. The gate electrode includes a source side, a drain side, and a channel side. The gate electrode is formed such that the second of the second spacers extends over the source side of the gate electrode, the bilayer spacer extends over the drain side of the gate electrode, and the gate dielectric layer is positioned between the channel side of the gate electrode and the semiconductor substrate. The method further includes forming a first doped source/channel junction extending from the source region and a second doped drain/channel junction extending from the drain region. The first doped source/channel junction is positioned at least partially beneath the second of the plurality of second spacers and the second doped drain/channel junction is positioned at least partially beneath the bilayer spacer such that the gate electrode overlaps a larger area of the first doped source/channel junction than the second doped drain/channel junction.

Techniques and devices as disclosed herein can provide substantial beneficial technical effects. By way of example only and without limitation, one or more embodiments may provide one or more of the following advantages:

Precise overlay of source/drain patterning mask over a small gate not required;

Self-aligned sidewall image transfer (SIT) process enables asymmetry;

Spacers adjoining gates asymmetric;

Greater junction overlap of gate electrode on the source side and smaller junction overlap of gate electrode on the drain side;

Lower resistance on the source side and lower parasitic capacitance on the drain side.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of an illustrative asymmetric field-effect transistor fabricated on a silicon substrate. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

FIGS. 1-11 schematically illustrate an exemplary sequence of fabrication steps that may be employed in obtaining an asymmetric field-effect transistor. Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. While some individual processing steps are set forth herein, those steps are merely illustrative, and one skilled in the art may be familiar with several equally suitable alternatives that would be applicable.

Figure 1:
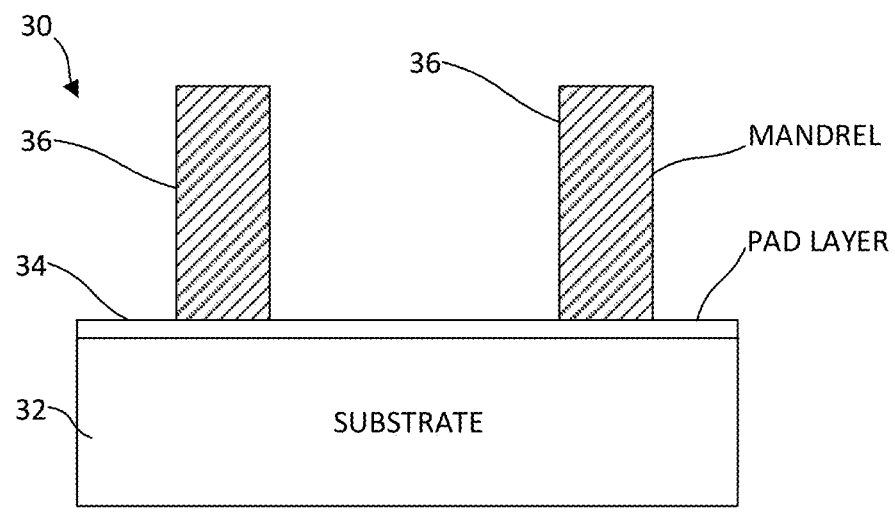
FIG. 1 is a schematic, cross-sectional view depicting a semiconductor substrate having mandrels formed thereon.

With reference now to FIG. 1, a structure 30 including bulk silicon wafer 32 is employed as the substrate in some embodiments. The substrate consists essentially of monocrystalline silicon in one or more embodiments. Single crystal silicon wafers are commercially available and are characterized by a diamond cube lattice structure. As known in the art, the Miller indices of a substrate are determined from the reciprocals of the points at which the crystal plane of silicon intersects the principle crystalline axes. While some exemplary embodiments relate to structures including doped or undoped (100) silicon as a substrate material, it will be appreciated that the principles expressed are applicable to other semiconductor substrates and substrates with crystallographic orientations other than (100). For example, substrates such as semiconductor-on-insulator (SOI) substrates as well as bulk substrates can be employed in accordance with the teachings herein.

Referring again to FIG. 1, a pad layer 34 such as a pad oxide or pad nitride layer is formed on the substrate. As known in the art, a thin silicon oxide or silicon nitride layer can be grown on a silicon wafer as a protective layer to facilitate downstream processes. Electrically isolated active regions are then formed from the substrate by techniques such as shallow trench isolation (STI). Each active region can comprise planar semiconductor structures, fin structures, nanowires, nanosheets, or any other suitable semiconductor materials.

Vertical mandrels 36 are formed on the substrate. The sacrificial mandrels may comprise, for example, amorphous silicon (a-Si) or polycrystalline silicon (polysilicon). The sacrificial material comprising the mandrels may be deposited by a deposition process such as, but not limited to, physical vapor deposition (PVD), chemical vapor deposition (CVD), plasma enhanced chemical vapor deposition (PECVD), inductively coupled plasma chemical vapor deposition (ICP CVD), atomic layer deposition (ALD), or any combination thereof. Hydrogenated amorphous silicon is typically deposited by plasma-enhanced chemical vapor deposition (PECVD) although other techniques such as hot-wire chemical vapor deposition (HWCVD) may be used. A layer of such sacrificial material is patterned to obtain discrete mandrels having substantially vertical side walls. A patterned mask (not shown) including openings corresponding to the mandrel locations may be formed on the layer of sacrificial material. The sacrificial material is then subjected to a reactive ion etch to remove the sacrificial material between the mandrels 36 down to the pad layer 34, which functions as an etch stop. The mandrels 36 may or may not have the same width. In some embodiments, mandrel width is in the range of ten to fifty nanometers (10-50 nm) and mandrel height is fifty to one hundred fifty nanometers (50-150 nm). Mandrel dimensions are exemplary and not limiting.

Figure 2:
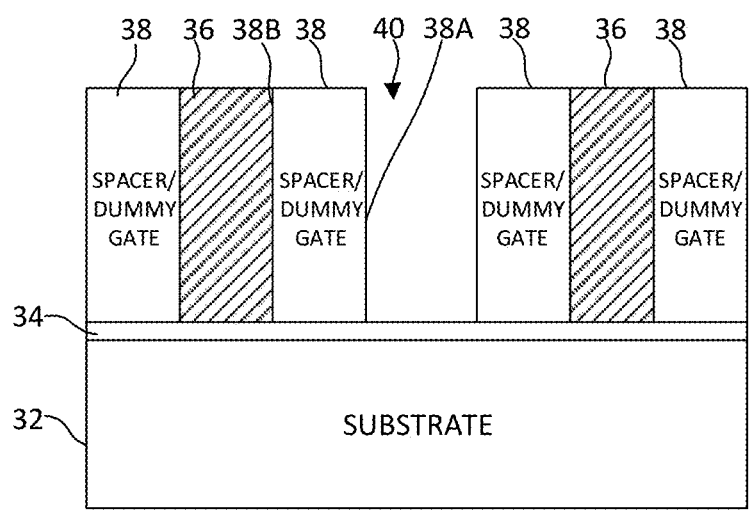
FIG. 2 is a cross-sectional view showing the structure of FIG. 1 following formation of dummy gate spacers on the mandrels.

Referring to FIG. 2, spacers/dummy gates 38 are formed on the mandrel sidewalls. Silicon nitride spacers/dummy gates are formed in some embodiments. A silicon nitride layer can be deposited via CVD, PECVD, sputtering, or other suitable technique to form the spacers. Amorphous carbon spacers/dummy gates are formed on the mandrel sidewalls in other embodiments using chemical vapor deposition (CVD) or other suitable process. The material chosen for spacer/dummy gate formation should be compatible with subsequent processing steps as described below. Spacer/dummy gate thickness is between ten and fifty nanometers (10-50 nm) in some embodiments. The spacers can be formed by any method known in the art, including depositing a conformal layer over the substrate and mandrels 36 and removing unwanted material using an anisotropic etching process such as reactive ion etching or plasma etching. The resulting structure includes trenches 40 between each set of mandrels and adjoining spacers/dummy gates and extending down to the pad layer 34. The trenches 40 may or may not have equal widths. Trench width can be in the range of ten to fifty (10-50 nm) in the exemplary embodiments.

Figure 3:
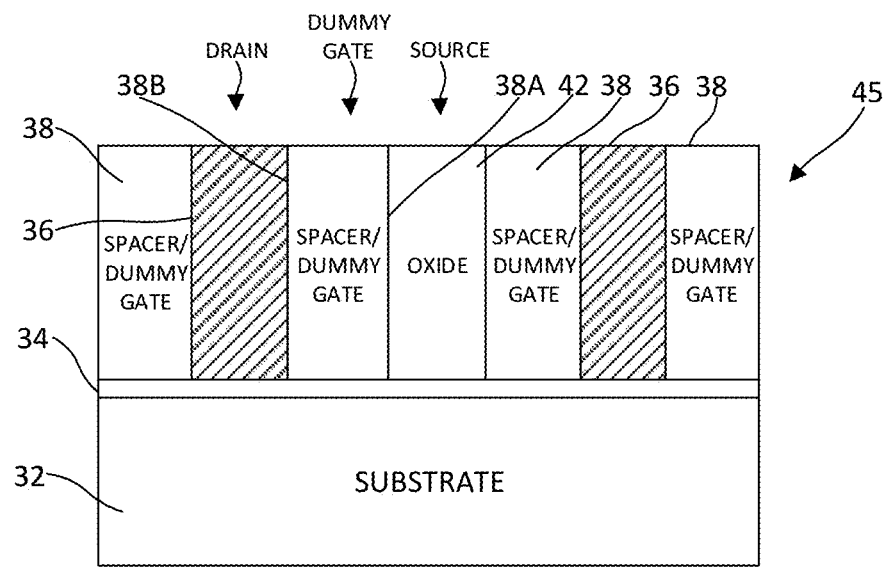
FIG. 3 is a schematic, cross-sectional view showing the structure of FIG. 2 following deposition of fill material between the spacers.

A filler material is deposited in the trenches 40 in obtaining a structure as schematically illustrated in FIG. 3. The filler material is different in composition from the materials comprising the mandrels 36 and spacers/dummy gates 38, which allows for selective etching thereof. Non-limiting examples of materials for the filler layers 42 include amorphous carbon, silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The resulting structure is planarized, for example by chemical mechanical planarization (CMP), to obtain the structure shown in FIG. 3. The heights of the mandrels 36, spacers/dummy gates 38 and filler layers 42 comprising the structure are substantially the same. As discussed further below, the regions occupied by adjoining mandrels 36, spacers/dummy gates 38 and filler layers 42 can later be employed to form source, gate and drain regions of asymmetric field-effect transistors. The spacers/dummy gates 38 may accordingly be employed as dummy gates that are replaced by metal gate material during subsequent processing. The dummy gates have source sides and drain sides.

Figure 4:
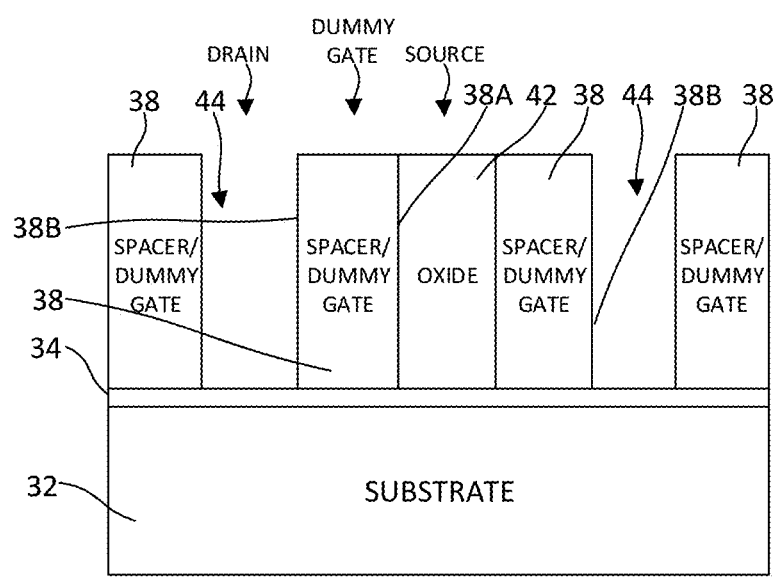
FIG. 4 is a schematic, cross-sectional view thereof following removal of the mandrels from the structure shown in FIG. 3.

The mandrels 36 are removed to form a structure as shown in FIG. 4. In embodiments including amorphous silicon mandrels, a wet etch using hot ammonia can be employed to selectively remove the mandrels while leaving the spacers/dummy gates 38 and the oxide layers 42, 34 substantially intact. Trenches 44 are accordingly formed between selected pairs of spacers/dummy gates 38.

Figure 5:
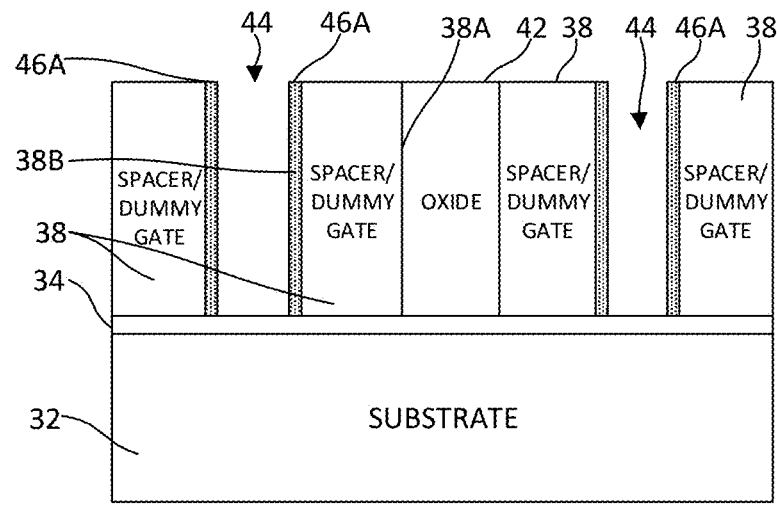
FIG. 5 is a schematic, cross-sectional view of the structure of FIG. 4 following formation of a first set of spacers on the dummy gate spacers.

A set of first dielectric sidewall spacers 46A is formed on the drain sides of the spacers/dummy gates 38, as schematically illustrated in FIG. 5. The first dielectric sidewall spacers may consist essentially of a first dielectric material, for example silicon oxide, silicon oxynitride, silicon nitride, SiBCN (siliconborocarbonitride) or SiOCN (siliconoxycarbonitride), SiOC (siliconoxycarbide). A conventional spacer formation process, namely, a conformal deposition process (e.g., ALD or CVD) followed by an anisotropic etch process (e.g., RIE) that acts to remove the just-deposited material from the horizontal surfaces, may be employed to form the sidewall spacers 46A. The widths of the trenches 44 are reduced by the sidewall spacers 46A formed on the drain sides of the spacers/dummy gates 38. Sidewall spacer thickness is between one and three nanometers (1-3 nm) in some embodiments. The thickness of the sidewall spacers 46A on each surface of the dummy gates is substantially the same in some embodiments.

Figure 6:
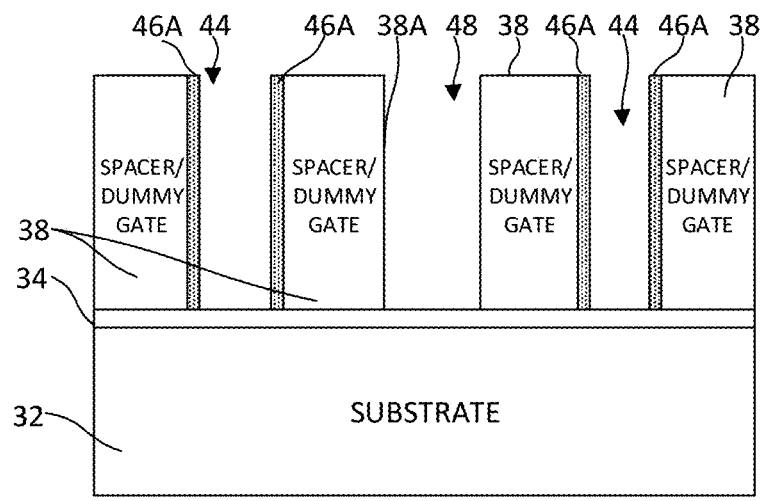
FIG. 6 is a schematic, cross-sectional view thereof following removal of the fill material between dummy gate spacers.
Figure 7:
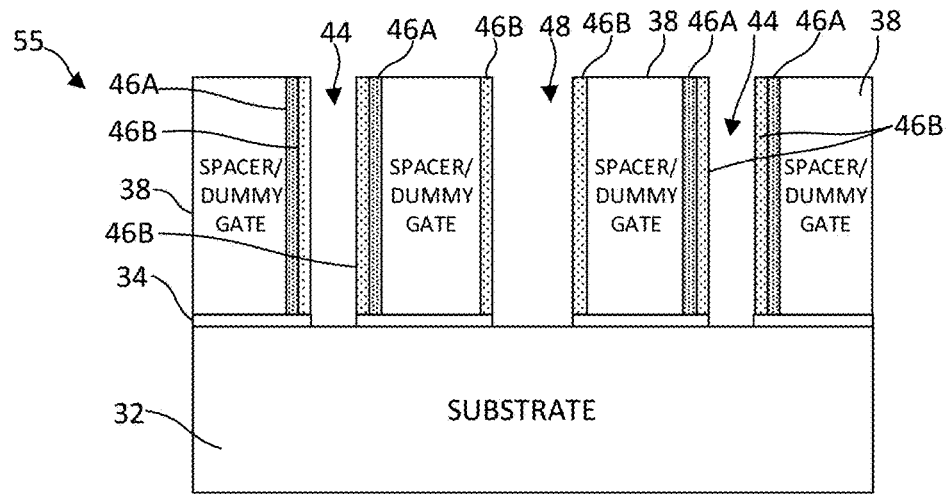
FIG. 7 is a schematic, cross-sectional view of the structure of FIG. 6 following formation of a second set of spacers on the dummy gate spacers.

The filler layers 42 between spacers/dummy gates 38 are removed to form additional trenches 48 extending down to the pad layer 34. One such trench 48 is shown in FIG. 6. A selective etch may be employed to remove the filler material, leaving the spacers/dummy gates 38 and the first sidewall spacers 46A substantially intact. In one embodiment, the filler layer 42 comprises amorphous carbon that can be selectively etched, for example, by ozone gas etching, or by oxygen plasma etching. Alternatively, amorphous carbon can be selectively etched by wet etch containing sulfuric acid and peroxide. If the filler layer is oxide, it can be selectively etched using $CHF_3$/Ar plasma or a wet etch containing hydrofluoric acid. (If, for example, the filler is oxide, the pad layer 34 will be nitride. The pad nitride layer 34 would remain after filler (layer 42) removal (FIG. 6) in such an embodiment.) A plurality of second dielectric sidewall spacers 46B are formed on the structure shown in FIG. 6 to obtain a structure 50 as shown in FIG. 7. The second dielectric sidewall spacers adjoin the first sidewall spacers 46A on the drain sides of the spacers/dummy gates 38. The second spacers 46B are deposited on spacer/dummy gate sidewalls and on top of the pad (e.g. nitride) layer. Spacer RIE is performed to form the spacers by removing spacer materials from horizontal surfaces (top of the pad layer 34). The exposed pad (nitride) layer 34 is then removed, for example, by a directional nitride etch (RIE), resulting in the structure shown in FIG. 7. Some pairs of opposing vertical surfaces of adjoining spacers/dummy gates 38 will include two discrete spacer layers (spacers 46A and 46B) comprising a bilayer spacer on each vertical surface. The thicknesses of the second sidewall spacers 46B is the same in some embodiments. Other opposing pairs of spacers on the source sides of the spacers/dummy gates 38 include only one spacer layer. Some of the trenches 44 are accordingly narrowed by more than one spacer layer forming a bilayer spacer on each side while other trenches 48 are narrowed only by one spacer layer on each side. The source and drain sides of the spacers/dummy gates will therefore include different numbers of spacer layers, the source sides including single-layer spacers and the drain sides including bilayer spacers in an exemplary embodiment. The spacer layers comprising each bilayer drain side spacer are discrete layers in that they are formed separately. The bilayer spacer includes an inner spacer layer comprising a dielectric material that is different from the outer spacer layer in some embodiments. A conformal deposition process (e.g., CVD) followed by an anisotropic etch process (e.g., RIE) that removes the just-deposited material from the horizontal surfaces, may be employed to form the second sidewall spacers 46B. The thickness of the second sidewall spacers 46B, which is in the range of four to eight nanometers (4-8 nm) in some embodiments, is selected to reduce parasitic capacitance on the drain side of the transistor, as discussed further below. The second sidewall spacers 46B consist essentially of silicon nitride in some embodiments. The second sidewall spacers can be formed from the same material as the first sidewall spacers 46A or a different material. The use of different materials is preferred to provide flexibility in tuning the process and transistor characteristics. For example, a first spacer material having a lower dielectric constant than the second sidewall spacer (46B) material can be selected to form the first spacers 46A. In addition to the thicker multi-layer spacer on drain side, the lower dielectric constant of the first spacer 46A further reduces the parasitic capacitance on drain side. Parasitic capacitance decreases as spacer thickness increases. The parasitic capacitance also decreases as the dielectric constant decreases. The higher dielectric constant of the second spacer material is process friendly, for example, facilitating the subsequent source/drain epitaxy. Generally speaking, the higher the dielectric constant a dielectric material is, the more robust the material is during epitaxy preclean and growth. Either or both sidewall spacers 46A, 46B may include multiple dielectric layers or consist of single dielectric layers.

Figure 8:
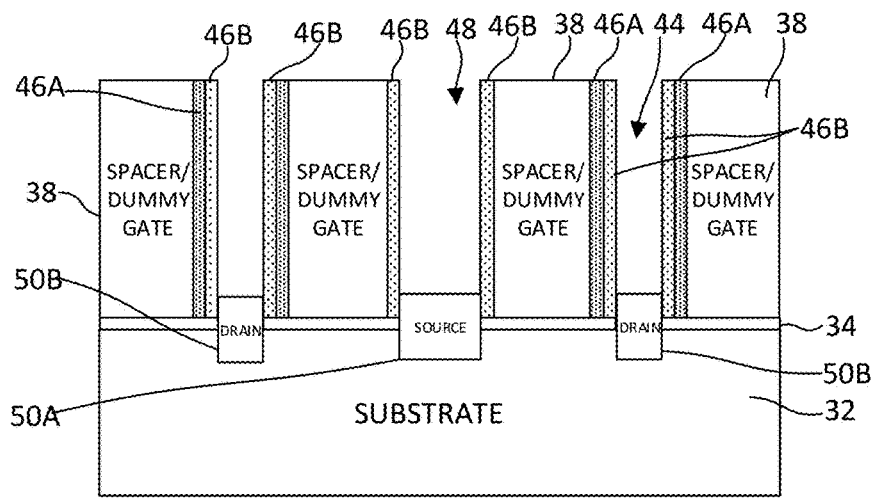
FIG. 8 is a schematic, cross-sectional view of the structure shown in FIG. 7 following formation of source/drain regions between the dummy gate spacers.

Source and drain regions 50A, 50B are formed on the substrate. The drain regions are aligned with the trenches 44 bounded by the bilayer spacers while the source region is aligned with the trench bounded by single spacer layers (layers 46B). In some embodiments wherein different sidewall spacer materials are used, the source and drain regions are grown between the sidewall spacers 46B having a relatively high dielectric constant compared to that of the initially formed sidewall spacers 46A. In some embodiments, the source and drain regions are epitaxially grown on the substrate 32 as schematically illustrated in FIG. 8. Optionally, the source/drain regions are recessed to form trenches before epitaxy. Epitaxial structures are then grown inside the trenches. Alternatively, the epitaxy is directly grown on the exposed surface of the semiconductor substrate. FIG. 8 shows the optional case including recesses 52. The terms "epitaxially growing and/or depositing" and "epitaxially grown and/or deposited" mean the growth of a semiconductor material on a deposition surface of a semiconductor material in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. The dopants may be incorporated in situ using appropriate precursors, as known in the art. By "in-situ" it is meant that the dopant that dictates the conductivity type of a doped layer is introduced during the process step, e.g., epitaxial deposition, that forms the doped layer. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. In a silicon-containing substrate, examples of n-type dopants, i.e., impurities, include but are not limited to antimony, arsenic and phosphorous. Exemplary epitaxial growth processes that are suitable for use in forming silicon and/or silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). Recesses 52 within the substrate, as shown in FIG. 8, are optionally formed prior to source/drain epitaxy in some embodiments as discussed above. The source/drain regions are grown within the recesses in such embodiments and include portions extending above the plane of the pad layer 34 and into the trenches 44, 48. Recesses within the semiconductor substrate can be formed using an anisotropic etch (e.g., by directional RIE), an isotropic etch (e.g., chemical downstream etch), or a combination of both. The recesses can have a rectangular, a V-shaped, a sigma shaped, or any shape configuration as a result of the chosen recess process(es). The source regions 50A are wider than the drain regions 50B in some embodiments.

Figure 9:
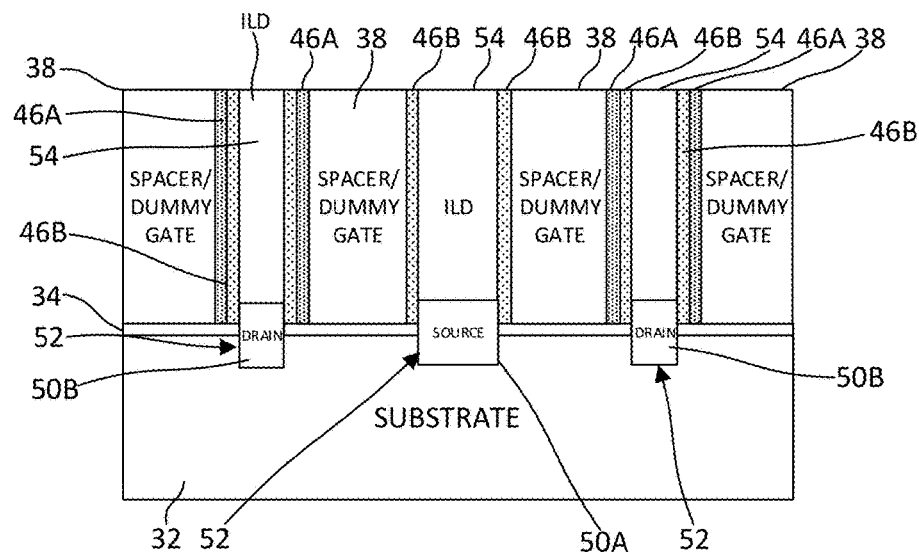
FIG. 9 is a schematic, cross-sectional view of the structure shown in FIG. 8 following deposition of an interlevel dielectric (ILD) layer and planarization.

An interlevel dielectric (ILD) layer 54 is deposited on the structure and fills the trenches 44, 48 above the doped, epitaxial source and drain regions 50A, 50B. The ILD layer 54 may be formed from any suitable dielectric material, including but not limited to spin-on-glass, a flowable oxide, a high density plasma oxide, borophosphosilicate glass (BPSG), or any combination thereof. The ILD layer is deposited by any suitable deposition process including but not limited to CVD, PVD, plasma-enhanced CVD, atomic layer deposition (ALD), evaporation, chemical solution deposition, or like processes. The ILD layer is planarized using chemical mechanical planarization (CMP), as known in the art, to obtain a structure as schematically illustrated in FIG. 9. The top surfaces of the spacers/dummy gates 38 are exposed following CMP. In some embodiments, the ILD layer can further comprise a liner (e.g., silicon nitride, not shown) on the spacer sidewalls before filling the rest of the trenches with oxide.

Figure 10:
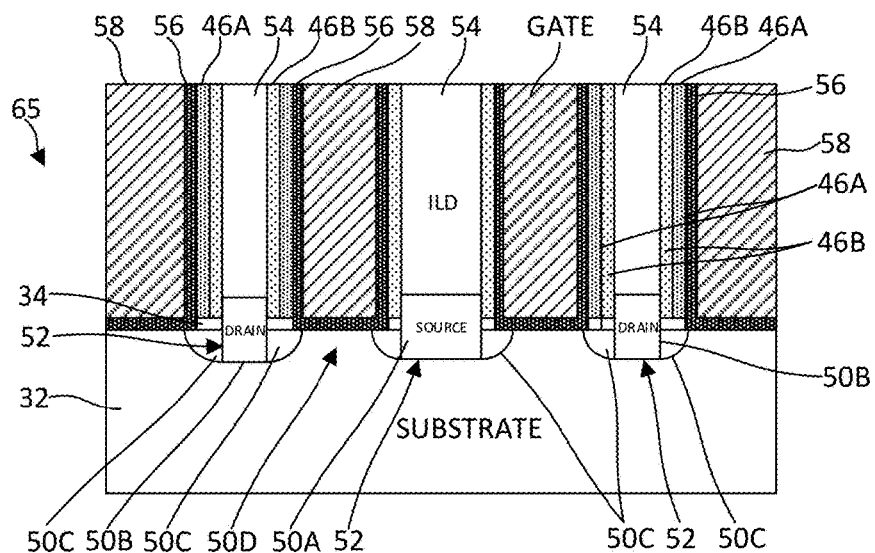
FIG. 10 is a schematic, cross-sectional view following removal of the dummy gate spacers and formation of metal gates in the structure shown in FIG. 9.

Referring now to FIG. 10, source/drain junctions 50C are formed by dopant diffusion from the source/drain epitaxy (regions 50A, 50B) into the semiconductor substrate 32. Techniques such as rapid thermal anneal (RTA) may be employed to cause dopant diffusion and formation of source/drain junctions. The junctions extend laterally from the source and drain regions and extend beneath the sidewall spacers 46A, 46B.

The spacers/dummy gates 38 and the portions of the pad layer 34 beneath the spacers/dummy gates 38 are removed to form trenches extending vertically down to the top surface of the substrate 32. In embodiments wherein the spacers/dummy gates 38 are formed from amorphous carbon, a conventional low temperature ashing process can be employed to remove these elements. The sidewall spacers 46A, 46B remain substantially intact. If the dummy gates are amorphous carbon, they can be removed by using oxygen plasma or ozone etch. If the dummy gates are silicon nitride, they can be removed either by wet etch (e.g., aqueous solution containing phosphoric acid) or dry etch (e.g., a plasma containing $SF_6/CH_4/N_2/O_2$ plasma). If the dummy gate is SiN, then the spacers should be materials different from SiN to provide etch selectivity. For example, the first spacers 46A can be SiBCN and the second spacers 46B can be SiOC. Both SiBCN and SiOC remain intact when SiN is etched.

A gate dielectric layer 56 forms portions of the gate stack that replace the spacers/dummy gates 38 for the asymmetric transistor devices to be fabricated. The gate dielectric layer 56 adjoins the sidewall spacers 46A, 46B and the channel regions 50D within the semiconductor substrate and between the source and drain regions. Non-limiting examples of suitable materials for the gate dielectric layer 56 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric layer 56 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In some embodiments, the gate dielectric layer includes multiple layers.

Electrically conductive gate material is deposited in the regions formerly containing the spacers/dummy gates 38. The deposited metal gate material forms the metal gate 58 of the asymmetric field-effect transistor, as shown in FIG. 10. The metal gate 58 includes a source side and a drain side. One of the second sidewall spacers 46B extends over the source side of the metal gate. One of the first sidewall spacers 46A and one of the second sidewall spacers 46B extend over the drain side of the metal gate. The spacers 46A, 46B extend to the pad layer 34, which is below the top surfaces of the source and drain regions in some embodiments. The bottom edges of the drain side spacers 46A, 46B are directly above the doped junctions 50C adjoining the drain regions 50B while the bottom edges of the source side spacers 46B are directly over the doped junctions 50C adjoining the source regions 50A. Non-limiting examples of suitable electrically conductive metals for forming the metal gate include aluminum (Al), platinum (Pt), gold (Au), silver (Ag), tungsten (W), titanium (Ti), cobalt (Co), or any combination thereof. The gate metal may be deposited using processes such as CVD, PECVD, PVD, plating, thermal or e-beam evaporation, or sputtering. A planarization process, for example, chemical mechanical planarization (CMP), is performed to polish the top surface of the deposited gate metal material. The asymmetric spacer assembly formed by the self-aligned process described above results in less gate/junction overlap on the drain side of the device and greater gate/junction overlap on the source side of the device.

In some embodiments, the conductive gate can include a work function metal (WFM) layer (not shown) disposed between the gate dielectric layer and another electrically conductive metal gate material. The WFM sets the transistor characteristics such as threshold voltage (Vt) to a predetermined value. In some embodiments, the WFM serves dual purposes: Vt setting and gate conductor. Non-limiting examples of suitable work function metals include p-type work function metal materials and n-type work function metal materials. P-type work function materials include compositions such as ruthenium, palladium, platinum, cobalt, nickel, and conductive metal oxides, titanium nitride, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, ALD, CVD, PECVD, PVD, plating, thermal or e-beam evaporation, and sputtering.

Figure 11:
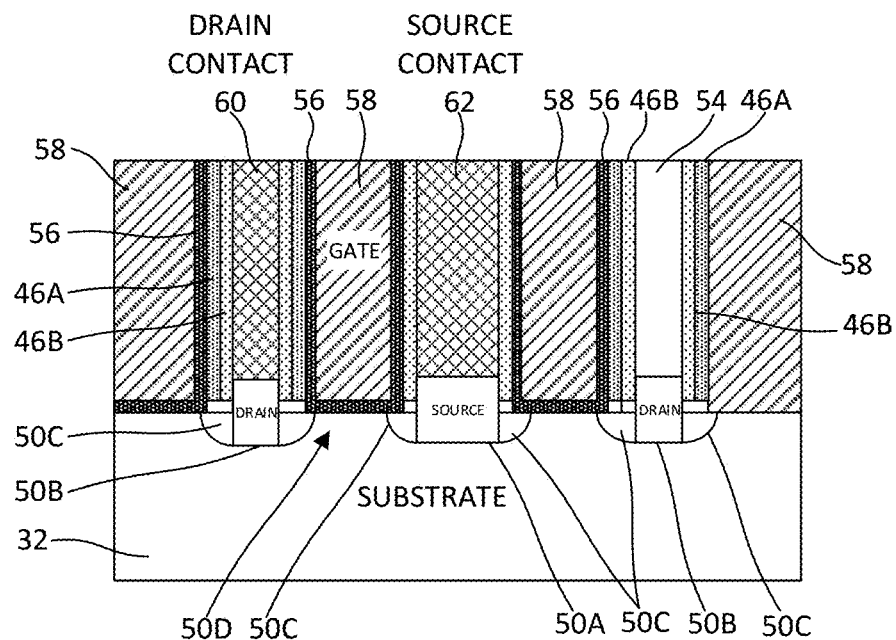
FIG. 11 is a schematic, cross-sectional view thereof following contact formation.

Drain contacts 60, source contacts 62 and gate contacts (not shown) are formed to obtain a structure 70 as shown in FIG. 11. The structure 70 includes multiple asymmetric field-effect transistor devices, one of such devices 100 being shown in FIG. 12. If needed, an insulator cap (not shown) can be formed on the top surface of the gate electrode prior to forming source/drain contacts. The insulator cap can be formed by recessing the gate electrode, depositing an insulator, and planarizing the insulator. The source/drain contacts are formed any suitable patterning and metallization processes. For example, a mask can be used to open the area where source/drain contacts are needed. The exposed ILD is removed to form contact trenches on top of source/drain. Conductive material(s) can then be deposited in the trenches followed by planarization to form source/drain contacts. The ILD can be removed by any suitable etch process. For example, it can be removed by RIE containing $CHF_3/Ar$ plasma. The ILD material within the vertical trenches above the source and drain regions is removed. ILD material above unused source or drain regions may remain on the structure. Contact material may, for example, include tantalum (Ta), aluminum (Al), platinum (Pt), gold (Au), tungsten (W), titanium (Ti), cobalt (Co) palladium (Pd) or any combination thereof. The contact material may be deposited by, for example, CVD, PECVD, PVD, plating, thermal or e-beam evaporation, or sputtering. The contact material may include a liner on trench sidewalls before filling the rest of the trench with an electrically conductive metal. Non-limiting liner materials include titanium nitride (TiN), tantalum nitride (TaN). A planarization process such as CMP is performed to remove any conductive material from the top surface of the structure 70. In some embodiments, insulator caps (not shown) can be formed on top of the source/drain contacts. The formation of the insulator caps on source/drain contacts is similar to the formation of the insulator cap on gate (e.g., recessing source/drain contacts, depositing and planarizing an insulator). As schematically illustrated, the source side of the metal gate includes a single spacer rather than a bilayer spacer as formed on the drain side thereof. There is accordingly greater overlap of the junction 50C extending from the source region with the gate stack and therefore a greater contact area between the junction 50C and the gate stack. Electrical resistance is relatively low. The drain side of the gate stack includes a bilayer spacer that is thicker than the single layer spacer on the source side. There is accordingly less overlap of the junction 50C on the drain side with the metal gate. The greater thickness of the bilayer spacer and the relatively small contact area between the junction 50C associated with the drain region and the bottom end of the gate stack results in relatively low parasitic capacitance. In some embodiments, the spacers 46A, 46B have different thicknesses. In some embodiments, the second sidewall spacers 46B are thicker than the first sidewall spacers 46A. The optional variation in thicknesses allows overlap of the junctions 50C with the gate stack to be precisely engineered. As discussed above, the spacers 46A, 46B are formed from different dielectric materials in some embodiments. In other embodiments, the spacers 46A, 46B are formed from the same dielectric material.

By taking advantage of the self-aligned sidewall image transfer process to enable asymmetry, as described above, the fabrication process does not require precise overlay of a source/drain patterning mask on a small gate. The formation of an asymmetric field-effect transistor having a small gate length can be challenging. Patterning one side of the transistor and processing the other side can create overlay/misalignment issues that are substantially avoided using the techniques described herein.

While the fabrication process and resulting devices have been described with respect to silicon-based transistors, it will be appreciated that materials other than those described herein, such as III-V compound semiconductor materials, can be employed in the formation of field-effect transistors having asymmetric spacers. The techniques and concepts disclosed herein can be applied in the fabrication of various types of field-effect transistors, including planar transistors and non-planar transistors (e.g. FinFET, nanosheet transistors, and nanowire transistors) where an asymmetric spacer configuration may be desirable to provide greater gate electrode/junction overlap on the source side of the transistor and relatively less gate electrode/junction overlap on the drain side of the transistor. In embodiments wherein FinFET devices are formed, the channel 50D in FIG. 11 will be a portion of a semiconductor fin. For nanosheet or nanowire transistors, the channel 50D in FIG. 11 may include one or multiple stacked nanosheets or nanowires.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material when forming a semiconductor structure. The techniques and application of etching are well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more layers of a type commonly used in such integrated circuit devices may not be explicitly shown in a given figure for ease of explanation. This does not imply that the layer(s) not explicitly shown are omitted in the actual integrated circuit device.

Figure 12:
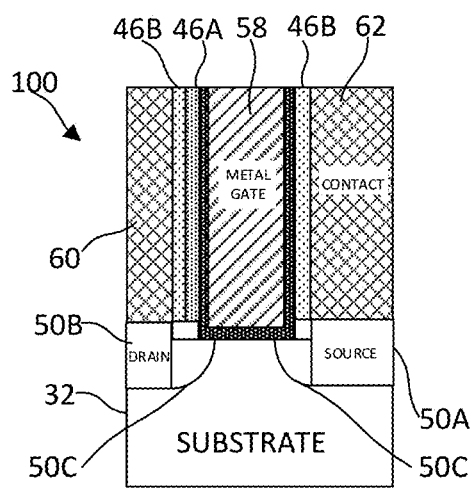
FIG. 12 is a schematic, cross-sectional view of an asymmetric field-effect transistor device formed in accordance with an exemplary fabrication process.

Given the discussion thus far, it will be appreciated that, in general terms, an exemplary asymmetric field-effect transistor device includes doped source and drain regions 50A, 50B, a semiconductor channel 50D operatively associated with the doped source and drain regions, a first doped junction 50C between the doped source region 50A and the semiconductor channel, a second doped junction 50C between the drain region 50B and the semiconductor channel, a gate electrode 58 including a drain side and a source side, and a gate dielectric layer 56 between the gate electrode and the semiconductor channel. A first drain side spacer 46A extends over the drain side of the gate electrode. A second drain side spacer 46B adjoins the first drain side spacer and also extends over the drain side of the gate electrode. A source side spacer 46B extends over the source side of the gate electrode. The first and second drain side spacers and the source side spacer are configured such that the gate electrode 58 overlaps a larger area of the first doped junction between the source region 50A and the semiconductor channel 50D than the second doped junction between the drain region 50B and the semiconductor channel. The source side spacer and the second drain side spacer 46B may consist essentially of a first dielectric material and the first drain side spacer 46A may consist essentially of a second dielectric material different from the first dielectric material. The first drain side spacer and the second drain side spacer can form a bilayer spacer having a combined thickness greater than the thickness of the source side spacer 46B. An exemplary asymmetric field-effect transistor device 100 is schematically illustrated in FIG. 12.

A method of fabricating an asymmetric field-effect transistor device includes obtaining a structure including a semiconductor substrate 32, a pad dielectric layer 34 on the substrate, a plurality of sacrificial mandrels 36 extending vertically from the pad dielectric layer, a pair of dummy gates 38 on each of the sacrificial mandrels, each dummy gate having a drain side 38B adjoining one of the sacrificial mandrels, and a filler layer 42 between a first dummy gate on a first of the sacrificial mandrels and a second dummy gate on a second of the sacrificial mandrels. FIG. 3 schematically illustrates an exemplary structure 45 including such elements. Each of the first and second dummy gates has a source side 38A adjoining the filler layer 42. The sacrificial mandrels 36 are removed, thereby forming a plurality of first trenches 44 between the drain sides 38B of the dummy gates 38, such as shown in FIG. 4. A plurality of first spacers 46A is formed on the drain sides of the dummy gates and within the first trenches as schematically illustrated in FIG. 5. The filler layer 42 between the first and second dummy gates is removed, thereby forming a second trench 48 (see FIG. 6) and exposing the source sides 38A of the first and second dummy gates 38. A plurality of second spacers 46B is formed on the plurality of first spacers 46A within the first trenches 44 and on the source sides 38A of the first and second dummy gates 38 within the second trench 48, thereby obtaining a structure 55 as schematically illustrated in FIG. 7. Doped drain and source regions 50B, 50A are formed on the semiconductor substrate. The doped drain region is aligned with one of the first trenches 44 and the doped source region 50A is aligned with the second trench 48, such as shown in FIG. 8. At least the first dummy gate 38 is removed and a gate dielectric layer is formed on the substrate. A gate electrode is formed over the gate dielectric layer, the gate electrode including a source side, a drain side, and a bottom side. FIG. 10 schematically illustrates the structure 65 following replacement of the dummy gate(s) with gate dielectric and gate electrode materials. One of the second spacers 46B extends over the source side of the gate electrode 58 and an opposing pair of the first and second spacers 46A, 46B extends over the drain side of the gate electrode. First and second doped junctions 50C extending respectively from the source region and from the drain region are formed. The first doped junction is positioned at least partially beneath the second spacer 46B extending over the source side of the gate electrode. The second doped junction 50C is positioned at least partially beneath a pair of the first and second spacers 46A, 46B extending over the drain side of the gate electrode. The gate electrode overlaps a larger area of the first doped junction than the second doped junction due to the configuration of the spacers on the source and drain sides, respectively. A portion of the semiconductor substrate 32 beneath gate dielectric layer and the bottom side of the gate electrode comprises the channel region 50D of the transistor, as indicated in FIGS. 10 and 11.

A further exemplary method for fabricating an asymmetric field-effect transistor device is also provided. Such a method includes obtaining a structure including a semiconductor substrate 32, a dummy gate 38 extending above the semiconductor substrate, the dummy gate having a drain side 38B and a source side 38A, and a protective layer (e.g. filler layer 42) on the source side of the dummy gate. A first spacer 46A is formed on the drain side of the dummy gate and the protective layer is removed. A plurality of second spacers 46B is formed. One of the second spacers is formed on the first spacer 46A to form a bilayer spacer. A second of the second spacers is formed on the source side 38A of the dummy gate. Doped drain and source regions 50B, 50A are formed on the semiconductor substrate. The dummy gate is removed and a gate dielectric layer 56 is formed on the substrate. A gate electrode 58 is formed over the gate dielectric layer. The gate electrode includes a source side, a drain side, and a channel side. The gate electrode is formed such that the second of the second spacers 46B extends over the source side of the gate electrode, the bilayer spacer (46A/46B) extends over the drain side of the gate electrode, and the gate dielectric layer is positioned between the channel side of the gate electrode and the semiconductor substrate. The method further includes forming a first doped source/channel junction 50C extending from the source region and a second doped drain/channel junction 50C extending from the drain region. The first doped source/channel junction is positioned at least partially beneath the second of the plurality of second spacers 46B and the second doped drain/channel junction is positioned at least partially beneath the bilayer spacer (46A/46B) such that the gate electrode overlaps a larger area of the first doped source/channel junction than the second doped drain/channel junction, such as illustrated in FIG. 11. In some embodiments of the method, the first spacer 46A is formed from a first dielectric material and the second spacers are formed from a second dielectric material, the first dielectric material having a lower dielectric constant than the second dielectric material.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits. Any of the exemplary devices illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having asymmetric transistors therein formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this invention is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" or adjoining another layer, it will be understood that there may or may not be intermediate elements or layers between the two specified layers. If a layer is described as "on" or "directly on" another layer, direct contact of the two layers is indicated.

The corresponding structures, materials, acts, and equivalents of means or step-plus-function elements, if any, in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical invention. It is submitted with the understanding that it will not be used to interpret or limit the scope or meaning of the claims. In addition, in the foregoing Detailed Description, it can be seen that various features are grouped together in a single embodiment for the purpose of streamlining the invention. This method of invention is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. An improved asymmetric field-effect transistor device including a doped source region, a doped drain region, a semiconductor channel operatively associated with the doped source region and the doped drain region, a first doped junction between the doped source region and the semiconductor channel, a second doped junction between the drain region and the semiconductor channel, a gate electrode including a drain side and a source side, and a gate dielectric layer between the gate electrode and the semiconductor channel, wherein the improvement comprises:
    a first drain side spacer extending over the drain side of the gate electrode;
    a second drain side spacer adjoining the first drain side spacer, the second drain side spacer being discrete from the first drain side spacer and extending over the drain side of the gate electrode; and
    a source side spacer extending over the source side of the gate electrode;
    wherein the first and second drain side spacers and the source side spacer comprise dielectric materials and are configured such that the gate electrode overlaps a larger area of the first doped junction between the source region and the semiconductor channel than the second doped junction between the drain region and the semiconductor channel;
    further including:
    an electrically conductive drain contact electrically connected to the drain region; and
    an electrically conductive source contact electrically connected to the source region,
    wherein the second drain side spacer adjoins the drain contact and the source side spacer adjoins the source contact;
    wherein the gate electrode includes a bottom surface above the semiconductor channel, a portion of the gate dielectric layer being positioned between the bottom surface of the gate electrode and the semiconductor channel, the gate electrode further including first and second vertical surfaces extending from the bottom surface, the first drain side spacer and the second drain side spacer extending over the first vertical surface of the gate electrode and the source side spacer extending over the second vertical surface of the gate electrode, the first drain side spacer and the second drain side spacer having a combined thickness greater than the thickness of the source side spacer.

2. The improved asymmetric field-effect transistor device of claim 1, wherein:
    the first drain side spacer consists essentially of a first dielectric material,
    the source side spacer and the second drain side spacer consist essentially of a second dielectric material, and
    wherein the first dielectric material has a different composition than the second dielectric material.

3. The improved asymmetric field-effect transistor device of claim 1, further including:
    a semiconductor substrate;
    a pad dielectric layer on the semiconductor substrate;
    wherein the first and second drain side spacers and the source side spacer extend vertically with respect to the pad dielectric layer and adjoin the pad dielectric layer.

4. The improved asymmetric field-effect transistor device of claim 1, wherein the first drain side spacer and the second drain side spacer include first and second bottom edge portions, respectively, in opposing relation to the second doped junction between the drain region and the semiconductor channel, and further wherein the source side spacer includes a third bottom edge portion in opposing relation to the first doped junction between the source region and the semiconductor channel.

5. The improved asymmetric field-effect transistor device of claim 4, further including a pad dielectric layer, the pad dielectric layer including a first pad dielectric portion between and directly contacting the second doped junction and the first and second bottom edge portions of the first drain side spacer and the second drain side spacer, respectively.

6. The improved asymmetric field-effect transistor device of claim 1, wherein:
    the first drain side spacer comprises a first dielectric material, the second drain side spacer and the source side spacer comprise a second dielectric material, the first dielectric material having a lower dielectric constant than the second dielectric material.

* * * * *